US012593625B2

(12) United States Patent
Hashigami

(10) Patent No.: US 12,593,625 B2
(45) Date of Patent: Mar. 31, 2026

(54) SEMICONDUCTOR LAMINATE, SEMICONDUCTOR DEVICE, AND METHOD FOR MANUFACTURING SEMICONDUCTOR DEVICE

(71) Applicant: SHIN-ETSU CHEMICAL CO., LTD., Tokyo (JP)

(72) Inventor: Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 386 days.

(21) Appl. No.: 18/018,913

(22) PCT Filed: Jun. 18, 2021

(86) PCT No.: PCT/JP2021/023252
§ 371 (c)(1),
(2) Date: Jan. 31, 2023

(87) PCT Pub. No.: WO2022/030114
PCT Pub. Date: Feb. 10, 2022

(65) Prior Publication Data
US 2023/0245883 A1      Aug. 3, 2023

(30) Foreign Application Priority Data

Aug. 6, 2020    (JP) ................................. 2020-133535
Mar. 17, 2021    (JP) ................................. 2021-043094

(51) Int. Cl.
*H01L 21/02*        (2006.01)
*C23C 16/40*        (2006.01)
(Continued)

(52) U.S. Cl.
CPC .......... *H01L 21/0242* (2013.01); *C23C 16/40* (2013.01); *C30B 25/04* (2013.01);
(Continued)

(58) Field of Classification Search
CPC ........... H01L 21/0242; H01L 21/02483; H01L 21/02505; H01L 21/02565;
(Continued)

(56) References Cited

U.S. PATENT DOCUMENTS 8,993,189 B2 * 3/2015 Higashi ................. H01M 8/249
                                                    429/458
2003/0203600 A1    10/2003 Chu et al.
(Continued)

FOREIGN PATENT DOCUMENTS

CN        101522942 A      9/2009
CN        104081498 A      10/2014
(Continued)

OTHER PUBLICATIONS

Jul. 23, 2024 extended Search Report issued in European Patent Application No. 21854515.0.
(Continued)

*Primary Examiner* — Dale E Page
*Assistant Examiner* — Quovaunda Jefferson
(74) *Attorney, Agent, or Firm* — Oliff PLC

(57)        ABSTRACT

A semiconductor laminate at least including: a base; a buffer layer; and a crystalline metal oxide semiconductor film containing at least one metal element and having a corundum structure, the semiconductor laminate having the buffer layer on a main surface of the base directly or via another layer, the semiconductor laminate having the crystalline metal oxide semiconductor film on the buffer layer. The buffer layer is a laminate structure of a plurality of buffer films each with a different composition, and at least two buffer films of the plurality of buffer films have a film thickness of 200 nm or more and 650 nm or less.

18 Claims, 3 Drawing Sheets

(51) Int. Cl.

| | | |
|---|---|---|
| *C30B 25/04* | (2006.01) | |
| *C30B 29/16* | (2006.01) | |
| *H10D 8/60* | (2025.01) | |

(52) U.S. Cl.
CPC ........ *C30B 29/16* (2013.01); *H01L 21/02483* (2013.01); *H01L 21/02505* (2013.01); *H01L 21/0251* (2013.01); *H01L 21/02565* (2013.01); *H10D 8/60* (2025.01)

(58) Field of Classification Search
CPC . H01L 21/02628; C23C 16/40; C23C 16/448; C30B 25/04; C30B 25/183; C30B 29/16; H10D 8/60; H10D 12/00; H10D 12/441; H10D 30/475; H10D 30/635; H10D 30/061; H10D 30/47; H10D 30/60; H10D 30/87; H10D 62/40; H10D 62/80; H10D 64/06; H10H 20/817; H10H 20/815; H10H 20/833
See application file for complete search history.

(56) References Cited

U.S. PATENT DOCUMENTS

| | | | |
|---|---|---|---|
| 2009/0087936 A1 | 4/2009 | Miki et al. | |
| 2010/0289004 A1* | 11/2010 | Nakahara .......... | H01L 21/02631 257/15 |
| 2014/0367676 A1* | 12/2014 | Haeming .......... | H10D 30/6755 257/43 |
| 2015/0111369 A1 | 4/2015 | Kim et al. | |
| 2019/0055646 A1 | 2/2019 | Oshima et al. | |
| 2019/0055667 A1 | 2/2019 | Oshima et al. | |
| 2019/0057865 A1 | 2/2019 | Oshima et al. | |
| 2020/0032418 A1 | 1/2020 | Goto et al. | |
| 2021/0313433 A1 | 10/2021 | Hashigami | |
| 2022/0059424 A1 | 2/2022 | Hashigami et al. | |

FOREIGN PATENT DOCUMENTS

| | | | |
|---|---|---|---|
| CN | 104576861 A | 4/2015 | |
| CN | 110504343 A | 11/2019 | |
| EP | 3 125 309 A1 | 2/2017 | |
| JP | 2013-028480 A | 2/2013 | |
| JP | 2014-072533 A | 4/2014 | |
| JP | 2017-118090 A | 6/2017 | |
| JP | 2018-002544 A | 1/2018 | |
| JP | 2019-033142 A | 2/2019 | |
| JP | 2019-034882 A | 3/2019 | |
| JP | 2019-034883 A | 3/2019 | |
| JP | 2020-001997 A | 1/2020 | |
| KR | 2019-0129854 A | 11/2019 | |
| TW | 202029285 A | 8/2020 | |
| WO | 2020/066575 A1 | 4/2020 | |

OTHER PUBLICATIONS

Aug. 24, 2021 International Search Report issued in International Patent Application No. PCT/JP2021/023252.
Feb. 7, 2023 International Preliminary Report on Patentability issued in International Patent Application No. PCT/JP2021/023252.
Jinno, Riena et al. "Reduction in edge dislocation density in corundum-structured alpha-Ga2O3 layers on sapphire substrated with quasi-graded alpha-(Al,Ga)2O3 buffer layers." Applied Physics Express, Jun. 1, 2016, vol. 9, pp. 071101-1-071101-4, http://doi.org/10.7567/APEX.9.071101.
Aug. 13, 2024 Office Action and Search Report issued in Chinese Patent Application No. 202180057772.7.
Feb. 21, 2023 Office Action issued in Japanese Patent Application No. 2022-021858.
Jun. 20, 2025 Office Action issued in Korean Patent Application No. 2023-7003593.
Oct. 29, 2025 Office Action issued in European Patent Application No. 21854515.0.
Feb. 3, 2026 Office Action issued in Indian Patent Application No. 202347005773.

* cited by examiner

[FIG. 1]
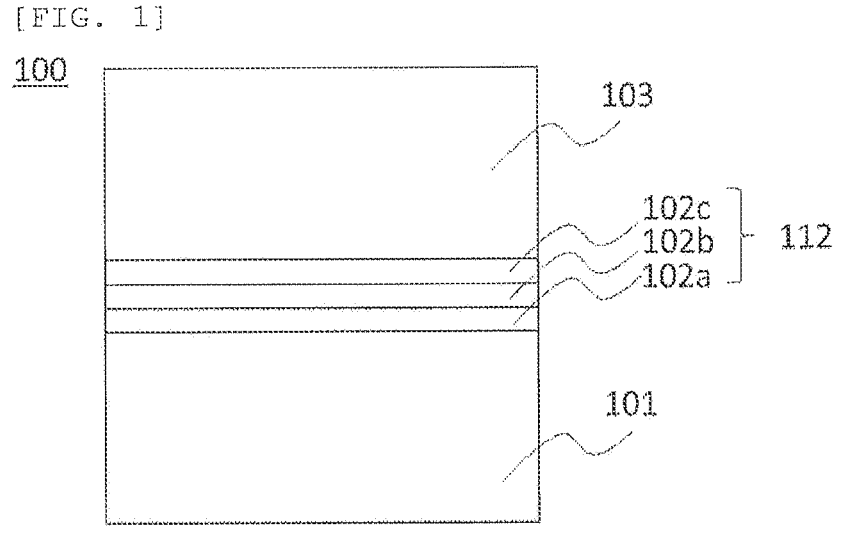
[FIG. 2]
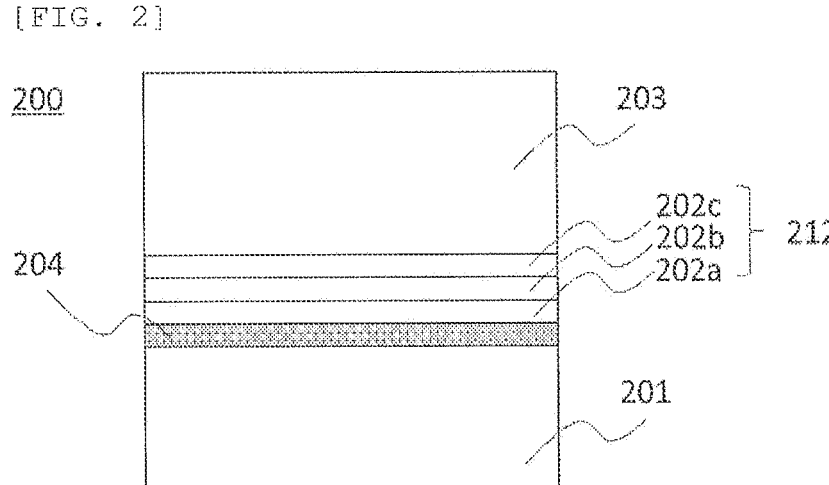
[FIG. 3]
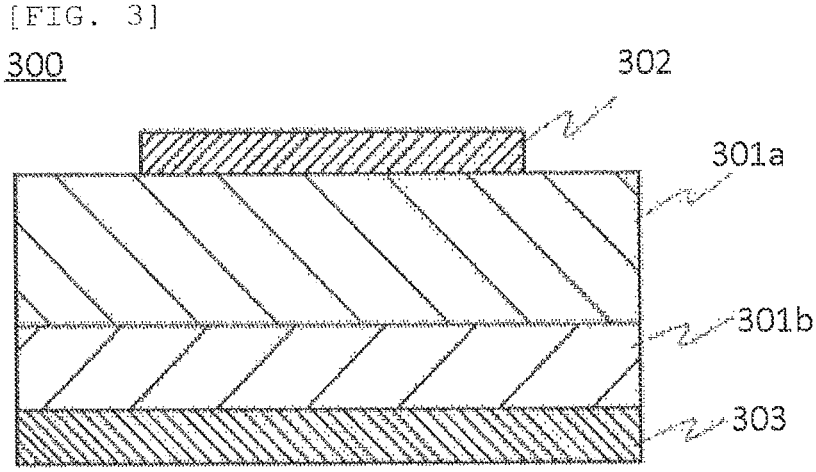

[FIG. 4]
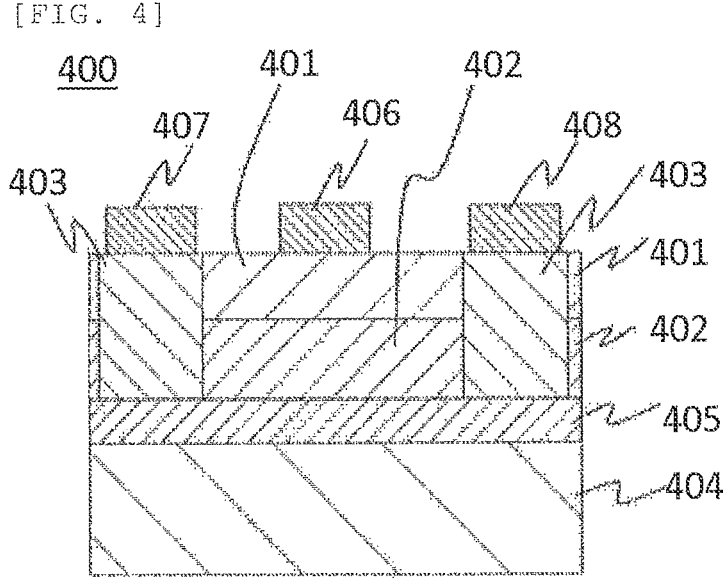
[FIG 5]

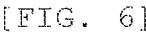
[FIG. 6]
600
606    605    607
603
604
602
601
604
608
[FIG. 7]
700
706
705
704
703
702
701
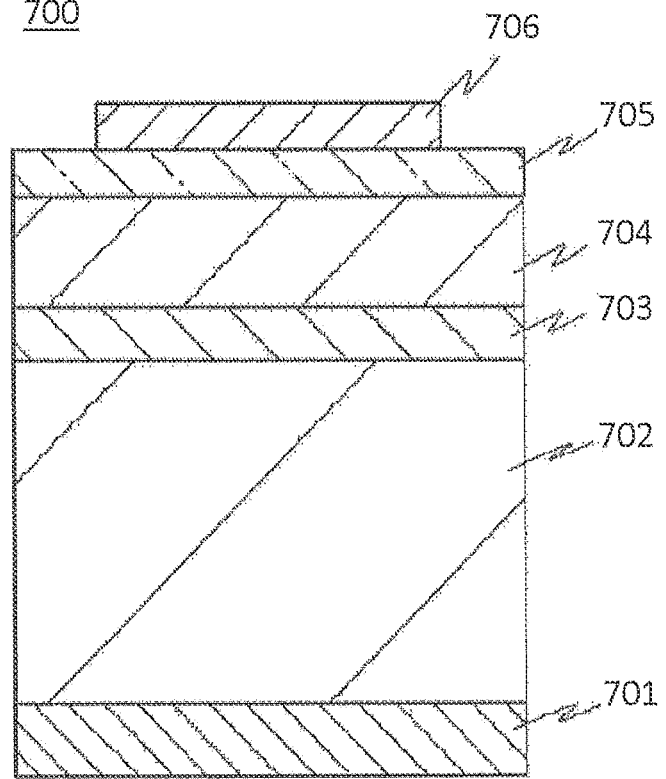

SEMICONDUCTOR LAMINATE, SEMICONDUCTOR DEVICE, AND METHOD FOR MANUFACTURING SEMICONDUCTOR DEVICE

TECHNICAL FIELD

The present invention relates to a semiconductor laminate, a semiconductor device, and a method for manufacturing a semiconductor device.

BACKGROUND ART

Semiconductor devices using gallium oxide ($Ga_2O_3$) with a large bandgap have been noted as next-generation switching devices capable of achieving high voltage, low loss, and high heat resistance. Such semiconductor devices are expected to find applications in power semiconductor apparatuses, such as inverters.

In particular, corundum $\alpha$-$Ga_2O_3$ metal oxides can be epitaxially grown using sapphire bases, which are relatively inexpensive, and available for atmospheric pressure processes such as a mist chemical vapor deposition (CVD) method (Patent Document 1) and a hydride vapor phase epitaxy (HVPE) method (Patent Document 2). For this reason, such metal oxides are expected to be manufactured at a lower cost than existing power semiconductor devices.

CITATION LIST

Patent Literature

Patent Document 1: JP 2013-028480 A
Patent Document 2: JP 2019-034882 A
Patent Document 3: JP 2018-002544 A

SUMMARY OF INVENTION

Technical Problem

On the other hand, problems with the heteroepitaxial growth as described above are that crystal defects, such as dislocations, and warpage and cracks occur due to stress caused by a lattice mismatch or a difference in thermal expansion coefficient between the base and the epitaxial layer. These problems become more pronounced especially when performing film formation on large-area bases, making their production difficult.

Patent Document 3 shows an example where an InAl-GaO-based semiconductor film with a corundum structure and a film thickness of 3 μm or more that does not contain any cracks in the area of 300 μm square or more is formed using an underlying substrate formed with two or more oxide layers. However, in practice the example shown in Patent Document 3 can suppress cracks only for small-diameter substrates with a dimeter of less than 4 inches (about 10 cm) and does not provide satisfactory effects for substrates of a practical size (diameter of 4 inches or greater). In addition, the example fails to suppress warpage of even small-diameter substrates.

The present invention has been made to solve the above problems. An object of the present invention is to provide a semiconductor laminate and a high performance semiconductor device including a high quality corundum crystalline metal oxide semiconductor film that experiences less crystal defects, warpage, and cracks even when formed by heteroepitaxial growth.

Solution to Problem

The present invention has been made to achieve the above object, and provides a semiconductor laminate at least comprising:

a base;
a buffer layer; and
a crystalline metal oxide semiconductor film containing at least one metal element and having a corundum structure, the semiconductor laminate having the buffer layer on a main surface of the base directly or via another layer, the semiconductor laminate having the crystalline metal oxide semiconductor film on the buffer layer, wherein the buffer layer is a laminate structure of a plurality of buffer films each with a different composition, and at least two buffer films of the plurality of buffer films have a film thickness of 200 nm or more and 650 nm or less.

The present invention also provides a semiconductor laminate at least comprising:

a base;
a buffer layer; and
a crystalline metal oxide semiconductor film containing at least one metal element and having a corundum structure, the semiconductor laminate having the buffer layer on a main surface of the base directly or via another layer, the semiconductor laminate having the crystalline metal oxide semiconductor film on the buffer layer, wherein the buffer layer is a laminate structure of a plurality of buffer films each with a different composition, and all of the plurality of buffer films have a film thickness of 200 nm or more and 650 nm or less.

With such a buffer layer, stress due to a lattice mismatch between the base and the crystalline metal oxide semiconductor film can be effectively mitigated, allowing for producing a semiconductor laminate including a high quality crystalline metal oxide semiconductor film with reduced crystal defect introduction and further with less cracks and warpage.

The buffer films preferably contain a main metal element of the crystalline metal oxide semiconductor film that is the most abundant among metal elements contained in the crystalline metal oxide semiconductor film.

Further, the buffer layer is preferably a laminate structure in which the plurality of buffer films are laminated such that a proportion of the main metal element of the crystalline metal oxide semiconductor film increases from the base side toward the crystalline metal oxide semiconductor film side of the buffer layer.

This can further increase the stress mitigating effect of the buffer layer, so that the crystalline metal oxide semiconductor film on the buffer layer can be of higher quality.

The buffer films preferably contain a main metal element of an underlayer of the buffer layer that, is the most abundant among metal elements contained in the underlayer.

Further, the buffer layer is preferably a laminate structure in which the plurality of buffer films are laminated such that a proportion of the main metal element of the underlayer of the buffer layer decreases from the base side toward the crystalline metal oxide semiconductor film side of the buffer layer.

This can further increase the stress mitigating effect of the buffer layer, so that the crystalline metal oxide semiconductor film on the buffer layer can be of higher quality.

The underlayer of the buffer layer preferably the base, and the main metal element of the base is preferably aluminum.

Wafers containing aluminum as a main metal element, such as sapphire wafers, are suitable for use as the base from both a quality and cost standpoint.

The main metal element of the crystalline metal oxide semiconductor film is preferably gallium.

Gallium oxide films, which have a large bandgap, are suitable for use as the crystalline metal oxide semiconductor film according to the present invention.

The crystalline metal oxide semiconductor film preferably has a film thickness of 1 μm or more.

This makes the crystalline metal oxide semiconductor film of higher quality.

The main surface of the base preferably has an area of 10 cm² or more.

This makes the crystalline metal oxide semiconductor film of even higher quality. This also provides higher flexibility in device design.

A semiconductor device at least comprising the buffer layer and the crystalline metal oxide semiconductor film of the semiconductor laminate described above is preferably provided.

This results in a high performance semiconductor device with excellent electrical properties.

Also, the present invention provides a method for manufacturing a semiconductor device at least including a crystalline metal oxide semiconductor film and an electrode, comprising:

a step of forming a plurality of buffer films, each with a different composition, as a buffer layer on a main surface of a base, the plurality of buffer films including two or more buffer films with a thickness of 200 nm or more and 650 nm or less;

a step of forming a crystalline metal oxide semiconductor film with a corundum structure on the buffer layer; and a step of forming an electrode at least on the crystalline metal oxide semiconductor film.

The present invention further provides a method for manufacturing a semiconductor device at least including a crystalline metal oxide semiconductor film and an electrode, comprising:

a step of forming a plurality of buffer films, each with a different composition and a thickness of 200 nm or more and 650 nm or less, as a buffer layer on a main surface of a base;

a step of forming a crystalline metal oxide semiconductor film with a corundum structure on the buffer layer; and a step of forming an electrode at least on the crystalline metal oxide semiconductor film.

Forming such a buffer layer can effectively mitigate stress due to a lattice mismatch between the base and the crystalline metal oxide semiconductor film, allowing for producing a high performance semiconductor device employing a high quality crystalline metal oxide semiconductor film with reduced crystal defect introduction and further with less cracks and warpage.

Advantageous Effects of Invention

As described above, the present invention can provide a semiconductor laminate and a semiconductor device including a high quality corundum crystalline metal oxide semiconductor film that experiences less crystal defects, warpage, and cracks even when formed by heteroepitaxial growth, as well as a method for manufacturing such a semiconductor device. Additionally, a high performance semiconductor device can be manufactured by using the semiconductor laminate including the crystalline metal oxide semiconductor film according to the present invention.

BRIEF DESCRIPTION OF DRAWINGS

FIG. 1 illustrates an embodiment of a structure of the semiconductor laminate according to the present invention;

FIG. 2 illustrates another embodiment of the structure of the semiconductor laminate according to the present invention;

FIG. 3 illustrates an example Schottky barrier diode according to the present invention;

FIG. 4 illustrates an example high electron mobility transistor according to the present invention;

FIG. 5 illustrates an example semiconductor field effect transistor according to the present invention;

FIG. 6 illustrates an example insulated gate bipolar transistor according to the present invention; and FIG. 7 illustrates an example light emitting diode.

DESCRIPTION OF EMBODIMENTS

Hereinafter, the present invention will be described in detail, but the present invention is not limited to the following description.

As described above, a need has existed for a semiconductor laminate including a high duality corundum crystalline metal oxide semiconductor film that experiences less crystal defects, warpage, and cracks even when formed by heteroepitaxial growth.

The present inventors have earnestly studied to achieve the above object and consequently found that it is possible to effectively mitigate stress due to a lattice mismatch be a base and a semiconductor film by using a semiconductor laminate at least comprising: a base; a buffer layer; and a crystalline metal oxide semiconductor film containing at least one metal element and having a corundum structure, the semiconductor laminate having the buffer layer on a main surface of the base directly or via another layer, the semiconductor laminate having the crystalline metal oxide semiconductor film on the buffer layer, where the buffer layer is a laminate structure of a plurality of buffer films each with a different composition and at least two buffer films of the plurality of buffer films have a thickness of 200 nm or more and 650 nm or less, or where the buffer layer is a laminate structure of a plurality of buffer films each with a different composition and all of the plurality of buffer films have a film thickness of 200 nm or more and 650 nm or less, and thus it possible to produce a high quality semiconductor laminate with reduced crystal defect introduction and further with less cracks and warpage. This finding has led to the completion of the present invention.

The present inventors have also found that it is possible to produce a semiconductor device employing a high quality crystalline metal oxide semiconductor film with reduced crystal defects and further with less cracks and warpage, by using a method for manufacturing a semiconductor device at least including a crystalline metal oxide semiconductor film and an electrode, the method comprising: a step of forming a plurality of buffer films, each with a different composition, as a buffer layer on a main surface of a base, the plurality of buffer films including two or more buffer films with a thickness of 200 nm or more and 650 nm or less; a step of forming a crystalline metal oxide semiconductor film with a corundum structure on the buffer layer; and a step of forming an electrode at least on the crystalline metal oxide semiconductor film, or comprising: a step of forming a plurality of buffer films, each with a different composition and a thickness of 200 nm or more and 650 nm or less, as a buffer layer on a main surface of a base; a step of forming a crystalline metal oxide semiconductor film with a corundum structure on the buffer layer; and a step of forming an electrode at least on the crystalline metal oxide semiconductor film. This finding has led to the completion of the present invention.

A description will be given below with reference to the drawings.

(Semiconductor Laminate)

FIGS. 1 and 2 each illustrate an embodiment of a structure of the semiconductor laminate according to the present invention. The semiconductor laminates including a crystalline metal oxide semiconductor film according to the present invention (which may be each referred to hereinafter simply as a "semiconductor laminate") 100, 200 generally include bases 101, 201, buffer layers 112, 212, and crystalline metal oxide semiconductor films 103, 203, such that they are composed of the buffer layers 112, 212 formed on respective main surfaces of the bases 101, 201, and the crystalline metal oxide semiconductor films 103, 203 further formed on the respective buffer layers 112, 212.

(Base)

The bases 101, 201 are not particularly limited, provided that they contain a crystalline material as a main component, and may be any known substrate. The bases 101, 201 may be an insulator, a conductor, or a semiconductor. The bases 101, 201 may be monocrystalline or polycrystalline. It is preferred to use bases whose main metal element, which is the most abundant among metal elements contained therein, is aluminum. In particular, sapphire wafers are preferred from both a quality and cost standpoint.

The plane orientation of the main surface of the base is not particularly limited, and in the case of sapphire wafers, major planes such as c-, m-, and a-planes can be used. The base may have an off-angle with respect to a just surface. The off-angle is preferably 0-15 degrees, though not being limited thereto.

The thickness of the bases 101, 201 is not particularly limited, but about 200-800 $\mu$m is preferred from a cost standpoint. Also, the area of the main surface of the bases 101, 201 is preferably 10 cm$^2$ or more, and more preferably about 10 cm (4 inches) or more in diameter. By using such large-diameter bases 101, 201, the crystalline metal oxide semiconductor films 103, 203 formed on the respective bases 101, 201 can be of even higher quality and productivity. Using such large-diameter bases 101, 201 also provides higher flexibility in device design. The bases 101, 201 are not limited to particular shapes in the present invention.

(Buffer Layer)

The buffer layers 112, 212 may be formed on the base 101 directly as in FIG. 1, or may be formed thereon via another layer. By way of example, in cases where a delaminating layer for separating the crystalline metal oxide semiconductor film from the base is introduced as another layer, the buffer layers 112, 212 may be formed on a delaminating layer 204 as in FIG. 2.

(Buffer Film)

The buffer layers 112, 212 are laminated structures of a plurality of respective buffer films 102a, 102b, 102c, 202a, 202b, 202c each with a different composition. The buffer films each have a different composition. More preferably, the buffer films contain a main metal element of the crystalline metal oxide semiconductor films 103, 203 that is the most abundant among metal elements contained in the crystalline metal oxide semiconductor films 103, 203 (described below), or contain a main metal element of an underlayer of the buffer layers 112, 212 that is the most abundant among metal elements contained in the underlayer. Of course, the buffer films may contain both of the main metal element of the crystalline metal oxide semiconductor films 103, 203 and the main metal element of the underlayer of the buffer layers 112, 212. Here, the main metal element of the underlayer of the buffer layers 112, 212 refers to the main metal element of the base 101 in the embodiment of FIG. 1 and the main metal element of the delaminating layer 204 in the embodiment of FIG. 2.

It should be noted that while the buffer layers in the embodiments of FIGS. 1 and 2 are each composed of three buffer films, the present invention is not limited to such embodiments. The numbers and compositions of the buffer films as a whole may be adjusted as appropriate depending on conditions such as the thickness of the crystalline metal oxide semiconductor film, provided that two or more (plurality of) buffer films each with a different composition are formed. At this time, at least two buffer films of the two or more (plurality of) buffer films are each made to have a film thickness of 200 nm or more and 650 nm or less. The at least two buffer films may all be of the same thickness, or may be of different thicknesses. However, a thickness of less than 200 nm will not provide sufficient effects, and a thickness of more than 650 nm will give rise to significant stress and result in warpage and defects being introduced. Preferably, all of the two or more (plurality of) buffer films have a film thickness of 200 nm or more and 650 nm or less.

In cases where the buffer films contain the main metal element of the crystalline metal oxide semiconductor films 103, 203, preferably, the buffer films are laminated such that a proportion of the main metal element of the crystalline metal oxide semiconductor films 103, 203 increases from the bases 101, 201 side toward the crystalline metal oxide semiconductor films 103, 203 side. In cases where the buffer films contain the main metal element of the underlayer of the buffer layers 112, 212, preferably, the buffer films are laminated such that a proportion of the main metal element of the underlayer of the buffer layers 112, 212 decreases from the bases 101, 201 side toward the crystalline metal oxide semiconductor films 103, 203 side. For example, in cases where an $\alpha$-Ga$_2$O$_3$ crystalline metal oxide semiconductor film is formed on an Al$_2$O$_3$ wafer in the embodiment of FIG. 1, preferably, the buffer films are formed using (Al$_x$Ga$_{1-x}$)$_2$O$_3$ (0<x<1), and the value of x decreases from the buffer film 102a toward the buffer film 102c.

Preferably, use is made of a base that contains aluminum as its most abundant, main metal element among metal elements contained therein, and the base serves as the underlayer of the buffer layer. This is advantageous from both a quality and cost standpoint.

(Crystalline Metal Oxide Semiconductor Film)

The main component of the crystalline metal oxide semiconductor films 103, 203 is not particularly limited, provided that it is a crystalline metal oxide adopting a corundum structure. For example, the main component can be a crystalline metal oxide containing any of aluminum, titanium, vanadium, chromium, iron, gallium, rhodium, indium, and iridium. More preferably, the main metal element that is the most abundant among metal elements contained in the crystalline metal oxide semiconductor films 103, 203 is gallium. Specifically, the main component can be Al$_2$O$_3$, Ti$_2$O$_3$, V$_2$O$_3$, Cr$_2$O$_3$, Fe$_2$O$_3$, Ga$_2$O$_3$, Rh$_2$O$_3$, In$_2$O$_3$, or Ir$_2$O$_3$, and Ga$_2$O$_3$ is particularly preferred in the present invention. This is because Ga$_2$O$_3$ has a large bandgap and is expected to find its application as various semiconductor devices. Alternatively, the main component can be a binary metal oxide represented by $(A_xB_{1-x})_2O_3$ (0<x<1), where A and B denote two elements selected from the aforementioned metal elements, or a ternary metal oxide represented by $(A_xB_yC_{1-x-y})_2O_3$ (0<x<1, 0<y<1), where A, B, and C denote three elements selected from the aforementioned metal elements.

Further, the crystalline metal oxide semiconductor films 103, 203 may have a monolayer structure made of the aforementioned metal oxide, or may have a laminate structure of multiple crystal films with different compositions and different components such as dopants.

The crystalline metal oxide semiconductor films 103, 203 may have a film thickness of 1 μm or more, and preferably 3 μm or more. Such a film thickness can improve crystal orientations, resulting in a higher quality crystalline metal oxide semiconductor film.

Also, the semiconductor laminate according to the present invention may be doped with impurities to provide conductivity, depending on the design of the semiconductor devices etc. to which the semiconductor laminate is applied. When, for example, the semiconductor films 103, 203 at least contain gallium, suitable impurities can include any of silicon, germanium, tin, magnesium, and copper, or a combination of thereof. The conductivity type in this case will be an n-type. The concentration of impurities added by doping is generally $1\times10^{16}$ cm$^{-3}$ or more and $8\times10^{22}$ cm$^{-3}$ or less, though it depends on the design of the intended end product. In particular, the crystalline metal oxide semiconductor films 103, 203 can be a laminate of crystal films doped with impurities at different concentrations. The buffer layers 102, 202 may also be provided with conductivity by similar doping.

(Semiconductor Device)

Additionally, the semiconductor laminate according to the present invention as described above can be used to provide a semiconductor device that at least includes the buffer layer and the crystalline metal oxide semiconductor film of the semiconductor laminate. Such a semiconductor device may include or exclude the base. The semiconductor device according to the present invention is of high quality as it employs the high quality crystalline metal oxide semiconductor film with reduced crystal defect introduction and further with less cracks and warpage. Applications (specific examples) of the semiconductor device are discussed in detail below.

(Method for Manufacturing the Semiconductor Laminate)

The method for manufacturing the semiconductor laminate according to the present invention is not particularly limited. One can produce the semiconductor laminate by selecting the base and buffer layer as appropriate depending on the type of crystalline metal oxide semiconductor film and the semiconductor device to which the semiconductor laminate is applied, and performing film formation on the base. The film formation method is not particularly limited, and can be implemented by any of a variety of known techniques such as plasma CVD, low pressure CVD (LPCVD), atmospheric pressure CVD (APCVD), mist CVD, HVPE, sputtering, and ion plating.

(Method for Manufacturing the Semiconductor Device)

The buffer layer is formed on the main surface of the base directly or via another layer. The buffer layer is formed by depositing buffer films such that they have different compositions and include two or more buffer films with a thickness of 200 nm or more and 650 nm or less. Preferably, all of the plurality of buffer films constituting the buffer layer are deposited to have a thickness of 200 nm or more and 650 nm or less. A crystalline metal oxide semiconductor film with a corundum structure is formed on this buffer layer to produce the semiconductor laminate according to the present invention. Then, electrodes are further formed on the crystalline metal oxide semiconductor film to manufacture a semiconductor device. At this time, the semiconductor laminate including the base, the buffer layer, and the crystalline metal oxide semiconductor film may be used as it is; alternatively, the base may be removed to leave the buffer layer and the crystalline metal oxide semiconductor film, or the base and the buffer layer may be removed to only leave the crystalline metal oxide semiconductor film. Thus, a high performance semiconductor device can be manufactured that employs the high quality crystalline metal oxide semiconductor film with reduced crystal defect introduction and further with less cracks and warpage.

(Examples of Applicable Semiconductor Devices)

Semiconductor laminates including the crystalline metal oxide semiconductor film as described above have reduced defect densities and excellent electrical properties, which makes them industrially useful. Semiconductor laminates including such a crystalline metal oxide semiconductor film are suitable for use in various semiconductor devices and the like, and particularly useful for power devices.

Semiconductor laminates including the crystalline metal oxide semiconductor film according to the present invention can be classified into horizontal devices (horizontal devices) having electrodes formed on one side of the crystalline metal oxide semiconductor film and vertical devices (vertical devices) having electrodes on respective front and back sides of the crystalline metal oxide semiconductor film. While the semiconductor laminates including the crystalline metal oxide semiconductor film according to the present invention are suitable for use in both horizontal and vertical devices in the present invention, they are particularly preferred for use in vertical devices. Examples of semiconductor devices include a Schottky barrier diode (SBD), a metal semiconductor field effect transistor (MESFET), a high electron mobility transistor (HEMT), a semiconductor field effect transistor (MOSFET), a junction field effect transistor (JFET), an insulated gate bipolar transistor (IGBT), and a light emitting diode (LED).

Some preferred examples of the inventive crystalline metal oxide semiconductor film when it is applied to an n-type semiconductor layer (e.g., n$^+$-type semiconductor and n$^-$-type semiconductor layers) are described below with reference to the drawings. However, the present invention is not limited to these examples. It should be noted that semiconductor devices illustrated in the examples below may further include another layer (s) (e.g., insulator layers and conductor layers) and may exclude intermediate layers and buffer layers (buffer layers) as appropriate.

FIG. 3 illustrates an example SBD according to the present invention. The SBD 300 includes a relatively lightly doped n$^-$-type semiconductor layer 301a, a relatively heavily doped n$^+$-type semiconductor layer 301b, a Schottky electrode 302, and an ohmic electrode 303.

Materials for the Schottky electrode 302 and the ohmic electrode 303 may be any known electrode material. Examples of the electrode materials include metals such as aluminum, molybdenum, cobalt, zirconium, tin, niobium, iron, chromium, tantalum, titanium, gold, platinum, vanadium, manganese, nickel, copper, hafnium, tungsten, iridium, zinc, indium, palladium, neodymium, or silver or alloys of these metals, metal oxide conductive films such as tin oxide, zinc oxide, rhenium oxide, indium oxide, indium tin oxide (ITO), and indium zinc oxide (IZO), organic conductive compounds such as polyaniline, polythiophene, or polypyrrole, or mixtures and laminates thereof.

The Schottky electrode 302 and the ohmic electrode 303 can be formed by, for example, any known means such as a vacuum deposition method and a sputtering method. More specifically, for example, in the case of forming the Schottky electrode using two kinds of metals i.e., a first metal and a second metal, from the aforementioned metals, the Schottky electrode can be formed by laminating a layer of the first metal and a layer of the second metal and then patterning the layer of the first metal and the layer of the second metal using a photolithography technique.

When a reverse bias is applied to the SBD 300, a depletion layer (not shown) extends into the $n^-$-type semiconductor layer 301a, resulting in a high voltage SBD. Also, when a forward bias is applied, electrons flow from the ohmic electrode 303 to the Schottky electrode 302. Thus, the inventive SBD is excellent for use in high voltage and high current applications, has high switching speed, and has excellent withstand voltage and reliability.

FIG. 4 illustrates an example HEMT according to the present invention. The HEMT 400 includes a wide bandgap n-type semiconductor layer 401, a narrow bandgap n-type semiconductor layer 402, an $n^+$-type semiconductor layer 403, a semi-insulator layer 404, a buffer layer 405, a gate electrode 406, a source electrode 407, and a drain electrode 408.

FIG. 5 illustrates an example MOSFET according to the present invention. The MOSFET 500 includes an $n^-$-type semiconductor layer 501, $n^+$-type semiconductor layers 502 and 503, a gate insulator film 504, a gate electrode 505, a source electrode 506, and a drain electrode 507.

FIG. 6 illustrates an example IGBT according to the present invention. The IGBT 600 includes an n-type semiconductor layer 601, an $n^-$-type semiconductor layer 602, an $n^+$-type semiconductor layer 603, a p-type semiconductor layer 604, a gate insulator film 605, a gate electrode 606, an emitter electrode 607, and a collector electrode 608.

FIG. 7 illustrates an example LED according to the present invention. The LED 700 includes a first electrode 701, an n-type semiconductor layer 702, a light emitting layer 703, a p-type semiconductor layer 704, a transmissive electrode 705, and a second electrode 706.

Examples of materials for the transmissive electrode include conductive materials of oxides containing indium or titanium. More specific examples include $In_2O_3$, $ZnO$, $SnO_2$, $Ga_2O_3$, $TiO_2$, and $CeO_2$, a mixed crystal of any two or more of them, and materials doped with any of them. Providing any of these materials by any known means, such as sputtering, can form the transmissive electrode. After forming the transmissive electrode, thermal annealing may be applied to make the transmissive electrode transparent.

Examples of materials for the first electrode 701 and the second electrode 706 include metals such as aluminum, molybdenum, cobalt, zirconium, tin, niobium, iron, chromium, tantalum, titanium, gold, platinum, vanadium, manganese, nickel, copper, hafnium, tungsten, iridium, zinc, indium, palladium, neodymium, or silver or alloys of these metals, metal oxide conductive films such as tin oxide, zinc oxide, rhenium oxide, indium oxide, indium tin oxide (ITO), and indium zinc oxide (IZO), organic conductive compounds such as polyaniline, polythiophene, or polypyrrole, or mixtures thereof. The method for forming the electrodes is not particularly limited; the electrodes can be formed on the substrate according to the method that is appropriately selected, in consideration of compatibility with the aforementioned materials, from methods including wet methods such as a printing method, a spraying method, and a coating method, physical methods such as a vacuum deposition method, a sputtering method, and an ion plating method, and chemical methods such as a CVD method and a plasma CVD method.

EXAMPLE

The present invention is described below in detail using Examples, although these Examples do not limit the present invention.

Example 1

A semiconductor laminate was manufactured in the following manner using a mist CVD apparatus. Two atomizers (atomizer A, atomizer B) and a quartz tubular reactor were provided. The atomizers are connected with a quartz pipe, and the quartz pipe was branched to connect to the reactor.

Then, 34% strength hydrochloric acid was added to an aqueous solution containing 0.04 mol/L of gallium acetylacetonate such that the hydrochloric acid accounts for 1% by volume. This mixture was stirred with a stirrer for 60 minutes to produce a precursor. This precursor was filled into the atomizer A. Then, 34% strength hydrochloric acid was added to an aqueous solution containing 0.06 mol/L of aluminum acetylacetonate such that the hydrochloric acid accounts for 1% by volume. This mixture was stirred with a stirrer for 60 minutes to produce a precursor. This precursor was filled into the atomizer B.

Then, a 0.6 mm thick, 4 inch c-plane sapphire substrate was loaded into the reactor so as to rest on a quartz susceptor and heated to have a substrate temperature of 450° C. Then, using a 2.4 MHz ultrasonic transducer, ultrasonic vibration was propagated through water to the precursors in the atomizers A, B to atomize the precursors into a mist.

Subsequently, nitrogen gas was added to the atomizer A and the atomizer B at a total flow rate of 20 L/min, and the gas mixture of the mist and nitrogen gas was supplied to the reactor to form one buffer film with a film thickness of 400 nm on the substrate. The process was followed by laminating second to fourth buffer films by repeating similar film formation three times while reducing the Al proportion in the gas mixture through reduction of the nitrogen gas flow rate to the atomizer B. The Al/Ga ratios in the respective buffer films were 0.60, 0.30, 0.15, and 0.05, in this order from the first layer to the fourth layer. Then, the nitrogen gas supply to the atomizer B was stopped, and the gas mixture of the mist and nitrogen gas was supplied to the reactor for 180 minutes with the nitrogen gas at a flow rate of 20 L/min being supplied to the atomizer A, thereby forming a semiconductor film with a film thickness of about 7 μm.

Then, the nitrogen gas supply and the substrate heating were stopped, followed by cooling the substrate to near room temperature and then removing it from the reactor. The resulting semiconductor film was confirmed to be $\alpha$-$Ga_2O_3$ by X-ray diffraction measurement.

The fabricated film was then evaluated for cracks, warpage, and dislocation density. The presence of any crack was evaluated by defining it as linear defect of 1 mm or longer observed in bright field optical microscopy of the entire substrate surface. The warpage was evaluated by defining it as the shortest distance between the straight line connecting both ends of the substrate and the vertex of the concave or convex portion. The dislocation density was determined by TEM using a sample obtained by thinning the longitudinal section of the laminate into a 100 nm-thick piece.

Examples 2 and 3

Semiconductor laminates were fabricated in the same manner as in Example 1, except that each of the buffer films was made 200 nm thick (Example 2) and 650 nm thick (Example 3). The fabricated semiconductor films were confirmed to be α-Ga$_2$O$_3$ by X-ray diffraction measurement. The same evaluation as in Example 1 was then performed.

Comparative Examples 1 and 2

Semiconductor laminates were fabricated in the same manner as in Example 1, except that each of the buffer films was made 150 nm thick (Comparative Example 1) and 700 nm thick (Comparative Example 2). The fabricated semiconductor films were confirmed to be α-Ga$_2$O$_3$ by X-ray diffraction measurement. The same evaluation as in Example 1 was then performed.

Example 4

A semiconductor laminate was fabricated in the same manner as in Example 1, except that the first and second buffer films were made 150 nm thick. The fabricated semiconductor film was confirmed to be α-Ga$_2$O$_3$ by X-ray diffraction measurement. The same evaluation as in Example 1 was then performed.

Comparative Example 3

A semiconductor laminate was fabricated in the same manner as in Example 1, except that the first to third buffer films were made 150 nm thick. The fabricated semiconductor film was confirmed to be α-Ga$_2$O$_3$ by X-ray diffraction measurement. The same evaluation as in Example 1 was then performed.

Table 1 shows evaluation results for the cracks, warpage, and dislocation densities in Examples 1-3 and Comparative Examples 1 and 2. Table 2 shows evaluation results for the cracks, warpage, and dislocation densities in Example 4 and Comparative Example 3.

TABLE 1

| Buffer film thickness | Cracks | Warpage [mm] | Dislocation densities [cm$^{-2}$] |
|---|---|---|---|
| 150 nm | Present | 1.31 | 8 × 10$^{10}$ |
| 200 nm | Absent | 0.08 | 2 × 10$^9$ |
| 400 nm | Absent | 0.01 | 2 × 10$^9$ |
| 650 nm | Absent | 0.01 | 1 × 10$^9$ |
| 700 nm | Present | 2.20 | 3 × 10$^{10}$ |

TABLE 2

| Buffer film thickness | Cracks | Warpage [mm] | Dislocation densities [cm$^{-2}$] |
|---|---|---|---|
| 1st layer 150 nm 2nd layer 150 nm 3rd layer 400 nm 4th layer 400 nm | Absent | 0.03 | 2 × 10$^9$ |

TABLE 2-continued

| Buffer film thickness | Cracks | Warpage [mm] | Dislocation densities [cm$^{-2}$] |
|---|---|---|---|
| 1st layer 150 nm 2nd layer 150 nm 3rd layer 150 nm 4th layer 400 nm | Present | 1.20 | 8 × 10$^{10}$ |

The results of Examples shown in Tables 1 and 2 demonstrate that the semiconductor laminates according to the present invention are high quality films with less cracks and warpage and reduced dislocation densities. On the other hand, the semiconductor laminates of Comparative Examples produced by conventional techniques experienced cracks and significant warpage and also had high dislocation densities.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A semiconductor laminate at least comprising:
a base;
a buffer layer; and
a crystalline metal oxide semiconductor film containing at least one metal element and having a corundum structure, the semiconductor laminate having the buffer layer on a main surface of the base directly or via another layer, the semiconductor laminate having the crystalline metal oxide semiconductor film on the buffer layer, wherein
the buffer layer is a laminate structure of a plurality of buffer films each with a different composition, and
at least two buffer films of the plurality of buffer films have a film thickness of 200 nm or more and 650 nm or less, wherein
the buffer films contain a main metal element of the crystalline metal oxide semiconductor film that is the most abundant among metal elements contained in the crystalline metal oxide semiconductor film, and
the buffer layer is a laminate structure in which the plurality of buffer films are laminated such that a proportion of the main metal element of the crystalline metal oxide semiconductor film increases from the base side toward the crystalline metal oxide semiconductor film side of the buffer layer.

2. The semiconductor laminate according to claim 1, wherein the buffer films contain a main metal element of an underlayer of the buffer layer that is the most abundant among metal elements contained in the underlayer.

3. The semiconductor laminate according to claim 2, wherein the buffer layer is a laminate structure in which the plurality of buffer films are laminated such that a proportion of the main metal element of the underlayer of the buffer layer decreases from the base side toward the crystalline metal oxide semiconductor film side of the buffer layer.

4. The semiconductor laminate according to claim 1, wherein the underlayer of the buffer layer is the base, and the main metal element of the base is aluminum.

5. The semiconductor laminate according to claim 1, wherein the main metal element of the crystalline metal oxide semiconductor film is gallium.

6. The semiconductor laminate according to claim 1, wherein the crystalline metal oxide semiconductor film has a film thickness of 1 μm or more.

7. The semiconductor laminate according to claim 1, wherein the main surface of the base has an area of 10 cm² or more.

8. A semiconductor device at least comprising the buffer layer and the crystalline metal oxide semiconductor film of the semiconductor laminate according to claim 1.

9. A semiconductor laminate at least comprising:
a base;
a buffer layer; and
a crystalline metal oxide semiconductor film containing at least one metal element and having a corundum structure, the semiconductor laminate having the buffer layer on a main surface of the base directly or via another layer, the semiconductor laminate having the crystalline metal oxide semiconductor film on the buffer layer, wherein
the buffer layer is a laminate structure of a plurality of buffer films each with a different composition, and
all of the plurality of buffer films have a film thickness of 200 nm or more and 650 nm or less, wherein
the buffer films contain a main metal element of the crystalline metal oxide semiconductor film that is the most abundant among metal elements contained in the crystalline metal oxide semiconductor film, and
the buffer layer is a laminate structure in which the plurality of buffer films are laminated such that a proportion of the main metal element of the crystalline metal oxide semiconductor film increases from the base side toward the crystalline metal oxide semiconductor film side of the buffer layer.

10. The semiconductor laminate according to claim 9, wherein the buffer films contain a main metal element of an underlayer of the buffer layer that is the most abundant among metal elements contained in the underlayer.

11. The semiconductor laminate according to claim 10, wherein the buffer layer is a laminate structure in which the plurality of buffer films are laminated such that a proportion of the main metal element of the underlayer of the buffer layer decreases from the base side toward the crystalline metal oxide semiconductor film side of the buffer layer.

12. The semiconductor laminate according to claim 9, wherein the underlayer of the buffer layer is the base, and the main metal element of the base is aluminum.

13. The semiconductor laminate according to claim 9, wherein the main metal element of the crystalline metal oxide semiconductor film is gallium.

14. The semiconductor laminate according to claim 9, wherein the crystalline metal oxide semiconductor film has a film thickness of 1 μm or more.

15. The semiconductor laminate according to claim 9, wherein the main surface of the base has an area of 10 cm² or more.

16. A semiconductor device at least comprising the buffer layer and the crystalline metal oxide semiconductor film of the semiconductor laminate according to claim 9.

17. A method for manufacturing a semiconductor device at least including a crystalline metal oxide semiconductor film and an electrode, comprising:
a step of forming a plurality of buffer films, each with a different composition, as a buffer layer on a main surface of a base, the plurality of buffer films including two or more buffer films with a thickness of 200 nm or more and 650 nm or less, wherein
the buffer films contain a main metal element of the crystalline metal oxide semiconductor film that is the most abundant among metal elements contained in the crystalline metal oxide semiconductor film, and
the buffer layer is a laminate structure in which the plurality of buffer films are laminated such that a proportion of the main metal element of the crystalline metal oxide semiconductor film increases from the base side toward the crystalline metal oxide semiconductor film side of the buffer layer;
a step of forming a crystalline metal oxide semiconductor film with a corundum structure on the buffer layer; and
a step of forming an electrode at least on the crystalline metal oxide semiconductor film.

18. A method for manufacturing a semiconductor device at least including a crystalline metal oxide semiconductor film and an electrode, comprising:
a step of forming a plurality of buffer films, each with a different composition and a thickness of 200 nm or more and 650 nm or less, as a buffer layer on a main surface of a base, wherein
the buffer films contain a main metal element of the crystalline metal oxide semiconductor film that is the most abundant among metal elements contained in the crystalline metal oxide semiconductor film, and
the buffer layer is a laminate structure in which the plurality of buffer films are laminated such that a proportion of the main metal element of the crystalline metal oxide semiconductor film increases from the base side toward the crystalline metal oxide semiconductor film side of the buffer layer;
a step of forming a crystalline metal oxide semiconductor film with a corundum structure on the buffer layer; and
a step of forming an electrode at least on the crystalline metal oxide semiconductor film.

* * * * *